United States Patent
Mozer

(10) Patent No.: US 8,236,066 B2
(45) Date of Patent: Aug. 7, 2012

(54) METHOD AND CONFIGURATION FOR MELTING SILICON

(75) Inventor: Albrecht Mozer, Burghausen (DE)

(73) Assignee: Centrotherm Sitec GmbH, Blaubeuren (DE)

( * ) Notice: Subject to any disclaimer, the term of this patent is extended or adjusted under 35 U.S.C. 154(b) by 495 days.

(21) Appl. No.: 12/478,156

(22) Filed: Jun. 4, 2009

(65) Prior Publication Data

US 2009/0311161 A1 Dec. 17, 2009

(30) Foreign Application Priority Data

Jun. 5, 2008 (DE) .......................... 10 2008 026 811

(51) Int. Cl.
*B01J 6/00* (2006.01)
(52) U.S. Cl. .................................... 23/308 R; 23/295 R
(58) Field of Classification Search ................. 23/308 R, 23/295 R
See application file for complete search history.

(56) References Cited

U.S. PATENT DOCUMENTS

| 4,525,336 A | 6/1985 | Griesshammer et al. |
| 2009/0134251 A1 | 5/2009 | Von Campe et al. |

FOREIGN PATENT DOCUMENTS

| DE | 4207750 A1 | 10/1992 |
| DE | 102006011040 A1 | 9/2007 |
| EP | 0137306 A2 | 4/1985 |

*Primary Examiner* — Edward Johnson
(74) *Attorney, Agent, or Firm* — Laurence A. Greenberg; Werner H. Sterner; Ralph E. Locher

(57) ABSTRACT

A process for melting silicon, in which silicon bodies (4; 14; 24) are detached from a silicon starting material (2) - (40) -, the silicon bodies (4; 14; 24) being dimensioned - (40) - in such a way that they can be arranged in a heatable crucible (6), the silicone bodies (4; 14; 24) are arranged in the crucible (6) and the crucible (6) is heated - (46) -, at least some of the cavities (10) that occur between the crucible walls (7) and the silicon bodies (4; 14; 24) or between monolithic parts of the silicon bodies (4; 14; 24) when the silicon bodies (4; 14; 24) are arranged in the crucible (6) - (42) - being at least partially filled with silicon granules (8; 18; 20; 28) - (44) -, and an arrangement for melting silicon.

17 Claims, 3 Drawing Sheets

METHOD AND CONFIGURATION FOR MELTING SILICON

BACKGROUND OF THE INVENTION

Field of the Invention

The invention is based on a process for melting silicon, in which silicon bodies are arranged in a heatable crucible and the crucible is heated, and an arrangement for melting silicon, comprising a heatable crucible, silicon bodies arranged in the crucible, and cavities formed between the crucible walls and the silicon bodies or between monolithic parts of the silicon bodies.

Silicon is the starting material for a wide variety of semiconductor devices, in particular microprocessors or solar cells, the material having to meet high requirements in terms of purity. Silicon is usually obtained on an industrial scale by means of chemical deposition from a vapor phase, known as chemical vapor deposition processes or CVD processes for short. This usually involves chemical separation of silicon from a halosilane compound, in particular trichlorosilane, and deposition thereof on the surface of a heated seed body as pure polycrystalline silicon. This process is usually known as the "Siemens process", which is often carried out in "Siemens reactors" (see for example E 26 09 564 C2 or EP 1 257 684 B1). Thin silicon rods, heated by current flowing through them, are generally used as seed bodies, which are made to increase in diameter or volume by the accumulation of the polycrystalline silicon. Thin seed rods such as this are often arranged in a U-shaped form (cf. in turn DE 26 09 564 C2). With the accumulation of silicon, these grow into monolithic, U-shaped silicon rods. FIG. 2 schematically illustrates such a silicon rod after accumulation. However, depositions in other geometrical forms, for example tubes, are also possible in principle (cf. for example EP 1 257 684 B1).

The silicon obtained by means of CVD processes is generally very pure, but the starting materials obtained in these processes cannot be readily further processed on account of their form or their crystallinity. Depending on the intended use, moreover, further purification or general treatment may be necessary. In each of these cases, the silicon starting materials must therefore first be melted. For this purpose, silicon starting materials such as the U-shaped silicon rods or silicon tubes mentioned, first have to be comminuted and then the silicon fragments have to be melted in a crucible. Silicon is on the one hand very brittle, on the other hand comparatively hard in its monolithic form. The silicon starting material is therefore usually crushed by the action of mechanical force. This often takes place in a way similar to the comminution of mined ores.

As a result of contact with corresponding crushing equipment, impurities are introduced into the silicon material and may have harmful effects on semiconductor devices, and so these impurities have to be subsequently removed again. Therefore, after crushing, the fragments of silicon starting material are wet-chemically overetched and laboriously dried. As a result of the enormous increase in surface area, large-volume packaging of the purified fragments is also necessary, to protect against renewed introduction of impurities.

To avoid the laborious crushing and subsequent purifying steps, it is therefore attempted to melt the silicon starting materials directly in appropriate crucibles, dispensing with any crushing. However, the high melting temperature of silicon, in excess of 1400° Celsius, proves to be problematic here. For instance, to melt the large-volume silicon rods it is necessary for the crucibles to be overheated far above the melting point of silicon, with the walls inside the crucible being attacked and shedding crystoballites, which disturb the crystallization front when the silicon re-solidifies, and consequently adversely impairing the quality of the silicon.

BRIEF SUMMARY OF THE INVENTION

The present invention is therefore based on the object of providing a process and an arrangement by means of which the silicon starting material can be melted with as little introduction of impurities as possible and without any adverse impairment of the crucible walls.

This object is achieved on the one hand by a process with the features of claim 1, on the other hand by an arrangement with the features of claim 12.

Advantageous developments are respectively the subject of dependent subclaims.

The process according to the invention provides that silicon bodies are arranged in a heatable crucible. A silicon body is to be understood here initially as meaning a piece of silicon starting material, which in principle may be of any desired geometry. If the dimensions of the silicon starting material allow, a complete unit of silicon starting material, for example a complete U-shaped silicon rod, may also be arranged in the crucible as the silicon body. If one or more silicon bodies are arranged in the crucible, cavities occur between the crucible walls and the silicon bodies or between monolithic parts of a silicon body or different silicon bodies. At least some of these cavities are at least partially filled with silicon granules. Silicon granules are understood as meaning a mixture of silicon grains, which in principle may be of any desired geometry, but have much smaller dimensions than the silicon bodies, and so the cavities formed can be at least partially filled with them. In particular, the silicon granules may comprise what is known as finely crushed silicon. This is understood as meaning fine silicon fragments, for example chippings. Furthermore, the crucible is heated.

As a result of the at least partial filling of the cavities with silicon granules described, better thermal conductivity is obtained between the crucible walls and the silicon bodies, and so a better heat transfer from the crucible walls to the silicon bodies can take place. As a result, overheating of the crucible beyond the melting temperature of silicon is no longer necessary, or only to a slight extent, and so even large or unusually shaped silicon bodies can be heated to or above the melting temperature of silicon without the crucible being destroyed.

Silicon starting materials are often of dimensions that do not allow a complete unit of a silicon starting material to be arranged in the crucible. A variant of the invention that is particularly relevant in practice provides that the silicon bodies are detached from the silicon starting material and dimensioned in such a way that they can be arranged in the heatable crucible. The dimensioning of the silicon bodies preferably takes place in this case by silicon bodies with suitable dimensions being detached from the silicon starting material.

A development of the process according to the invention provides that the silicon bodies are detached from the silicon starting material in a controlled manner. Controlled detachment is to be understood here as meaning that the silicon body is detached along a determinable separating line, and the separating line is no longer obtained randomly, or is obtained less randomly than is the case with crushing for example. Controlled detachment of the silicon bodies is possible by means of laser separation, water jet cutting or sawing. Band saws, annular saws or wire saws, as are used inter alia for the sawing of silicon wafers or silicon ingots or rods, may be used as saws. Other methods of controlled detachment, such as for example by means of circular saws or grinding wheels, are also possible. However, in comparison with laser separation, water jet cutting or sawing, they entail increased introduction of impurities into the silicon bodies.

The controlled detachment of the silicon bodies allows the preparation of large-volume silicon bodies, which are preferably of a geometry that can be arranged in the crucible in a space-saving manner. The use of large silicon bodies has the effect of further reducing the introduction of impurities, and so it may be possible to dispense with purification of the silicon bodies, for example overetching, or this only needs to be carried out locally on the separating surface areas. Silicon bodies that are larger than 10 cm in at least one direction of extent have proven to be successful in practice.

In a preferred variant of the invention, silicon granules of grains having an approximate diameter of 0.3 to 10 mm are used. This has the advantage that the cavities can be easily filled to a great extent. A particularly preferred variant provides the use of silicon granules of grains having an approximate diameter of 0.3 to 2 mm, since the cavities can be filled even better with them.

The grains of the silicon granules are advantageously obtained by means of what is known as a fluidized bed process. This has the advantage that the grains are already in a comparatively pure form when they are obtained, and so additional purification before use in the crucible is not required. In principle, however, crushed silicon starting material or finely crushed silicon may also be used as silicon granules. Although this still has to be purified before it is introduced into the crucible, the proportion of silicon to be purified is less, since the purified silicon granules are only used for filling cavities, whereas the far greater part of the volume of the crucible is taken up by silicon bodies, which ideally do not require purification, or at least on much smaller surface areas.

As explained at the beginning, silicon is often obtained by means of the Siemens process in the form of silicon rods or silicon tubes, this being understood as meaning all forms of silicon rods or tubes, in particular straight, bent, angled or the already mentioned U-shaped rods or tubes. The silicon bodies can be easily detached from rods or tubes, in particular by controlled detachment, in that the rods or tubes are cut to length. The pieces obtained during cutting to length thereby form the silicon bodies, which can be arranged in the crucible in a comparatively easy and space-saving manner on account of the regular form. A variant of the invention therefore provides that silicon rods or tubes are used as the silicon starting material.

An advantageous development of the invention also provides that the detachment of the silicon bodies is realized by cutting the silicon rods or silicon tubes to length to obtain short silicon rods or short silicon tubes, the length of which corresponds approximately to the width of an opening of the crucible. In this way, the short silicon tubes or short silicon rods can be arranged in the crucible in a space-saving manner, which brings about greatest reduction of the separating surface areas and the associated risk of contamination.

The width of the opening is understood here as meaning the extent of the opening of the crucible in any desired direction, preferably in the direction of the greatest extent of the crucible.

Currently, crucibles with a square opening, the side lengths of which are approximately 35 cm, approximately 42 cm, approximately 54 cm or approximately 69 cm, are industrially used for the most part. In these cases, the side length corresponds to the width of the opening of the crucible. In practice, it has proven to be advantageous to cut the silicon rods or silicon tubes to length to obtain short silicon rods or short silicon tubes with lengths of approximately 30 to 35 cm, approximately 37 to 42 cm, approximately 48 to 54 cm or approximately 60 to 69 cm. In this way, the generation of separating surface areas, and the associated risk of introducing impurities, can be reduced. However, shorter short silicon rods or short silicon tubes may also be used in principle.

It has been found that the risk of adverse impairment of the crucible walls can be significantly reduced if the cavities are filled with silicon granules to 60 to 98%. A particularly efficient reduction of the risk of destruction and reduction of the use of energy is achieved if the cavities are filled with silicon granules to 85 to 98%.

The arrangement according to the invention for melting silicon has a heatable crucible in which silicon bodies are arranged. Formed between the crucible walls and the silicon bodies or between monolithic parts of the silicon bodies are cavities, at least some of which are at least partially filled with silicon granules.

Such an arrangement makes it possible to carry out the process according to the invention. To allow advantages of the invention that are described above to be efficiently used, a development of the arrangement provides that the silicon bodies are larger than 10 cm in at least one direction of extent.

A preferred variant of the arrangement provides that the silicon granules comprise grains with an approximate diameter of 0.3 to 2 mm, since these can represent an easily introducible and efficient filling of the cavities. As already described, it is also advantageous that the cavities are filled with silicon granules to 60 to 90%, or particularly advantageously to 85 to 98%.

In the case of an advantageous variant of the arrangement, short silicon rods or short silicon tubes are provided as silicon bodies, preferably those with a length that corresponds to the width of the opening of the crucible, since this makes efficient use of the crucible possible along with a reduced risk of the introduction of impurities.

The invention is explained in more detail below with reference to figures, in which:

DESCRIPTION OF THE INVENTION

Figure 1:
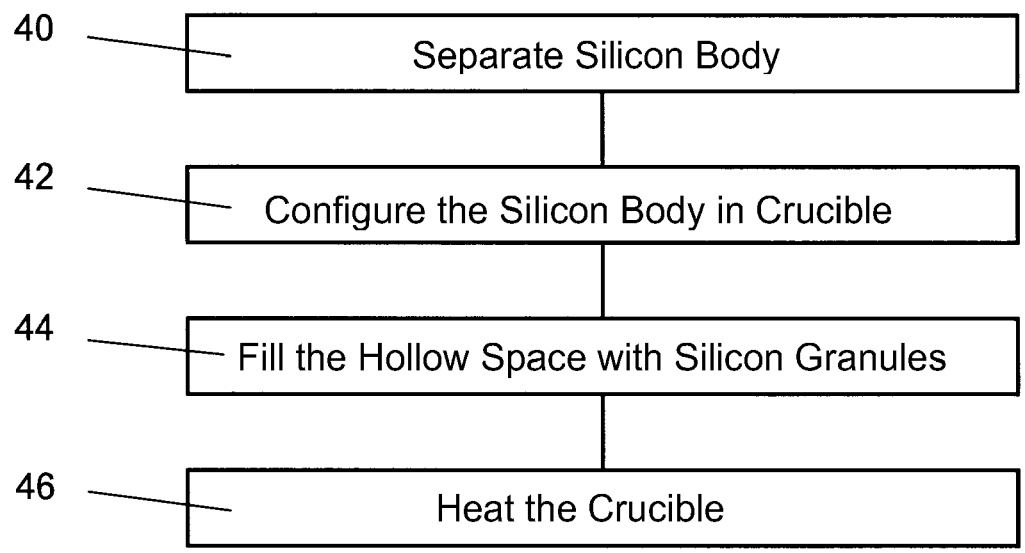
FIG. 1 shows a schematic basic representation of a variant of the process according to the invention.
Figure 2:
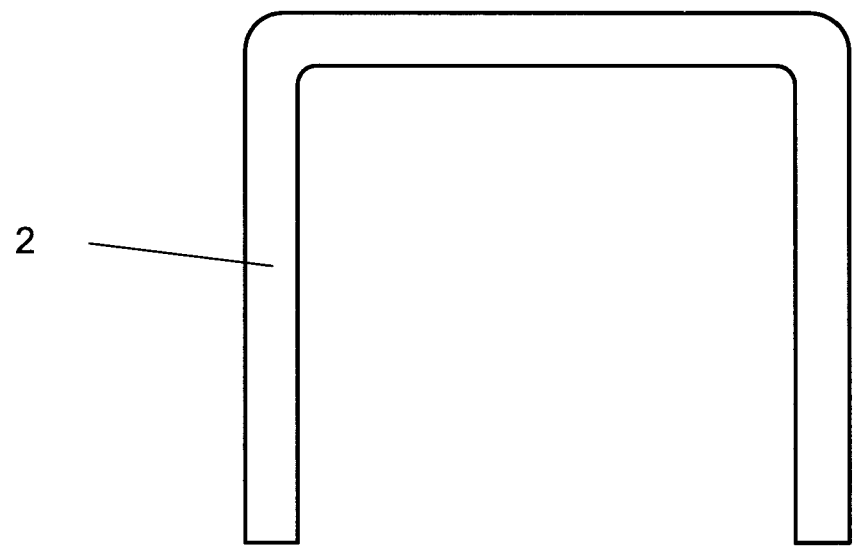
FIG. 2 shows a U-shaped silicon rod according to the prior art, forming silicon starting material.

FIG. 1 illustrates the sequence of a variant of the process according to the invention. Accordingly, first silicon bodies are detached from a silicon starting material-40. Suitable here as the silicon starting material are, inter alia, U-shaped silicon rods 2. An example of such a U-shaped silicon rod, as can be obtained for example in Siemens reactors, is reproduced in FIG. 2.

Figure 3:
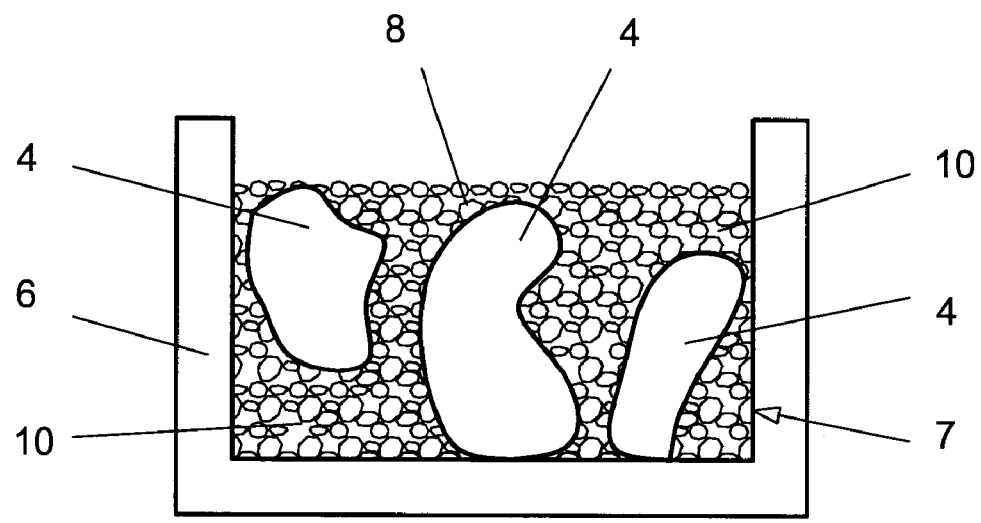
FIG. 3 shows a schematic sectional representation through a first exemplary embodiment of an arrangement according to the invention.

The detached silicon bodies may, in principle, be silicon bodies 4 of a regular form, as are reproduced by way of example in FIG. 3. The silicon bodies may, on the other hand, also be short silicon rods 14, 14a, 14b, 14c, 14d and 14e, as illustrated by the exemplary embodiments of FIGS. 4 and 5.

In the case of the process according to the invention, the silicon bodies 4; 14 are then arranged in a heatable crucible 6-42. At the same time as the silicon bodies 4; 14; 24 are arranged in the crucible 6-42-, the cavities 10 that occur between the crucible walls 7 and the silicon bodies 4; 14 to 24 or between monolithic parts of the silicon bodies 4; 14 to 24 are filled with silicon granules 8; 18; 28-44. Then the crucible 6 is heated-46-and the silicon bodies 4; 14; 24 and the silicon granules 8; 18; 28 are melted.

FIG. 3 shows an exemplary embodiment of an arrangement according to the invention. In this arrangement, the silicon bodies 4 are irregularly formed. For example, they may be large crushed fragments of a crushed silicon starting material which, as explained above, generally first undergo purification. On account of the regular form of the silicon bodies 4, comparatively large cavities 10 occur between the crucible walls 7 and the silicon bodies 4, or between different silicon bodies 4. In the representation of FIG. 3, all the cavities are filled with silicon granules 8.

Figure 4:
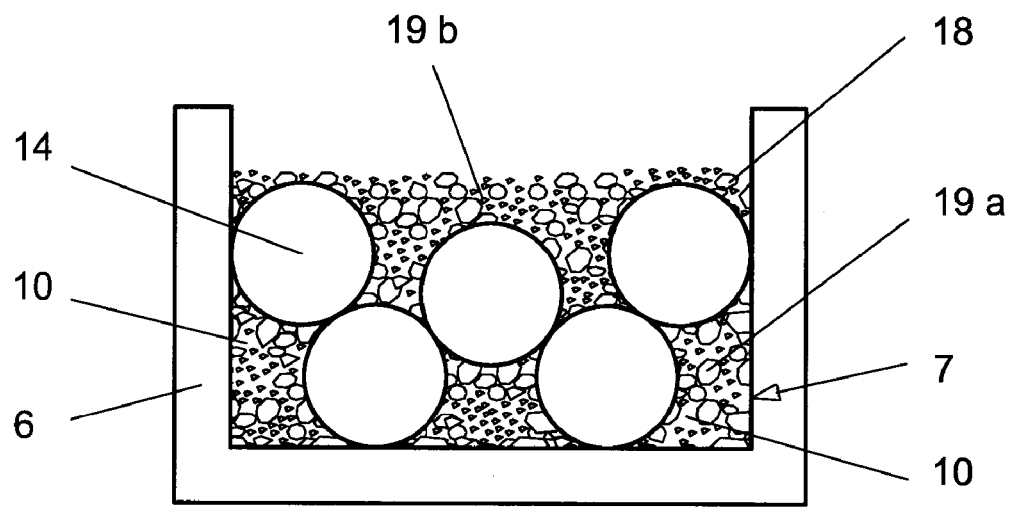
FIG. 4 shows a schematic sectional representation through a second exemplary embodiment of an arrangement according to the invention.
Figure 5:
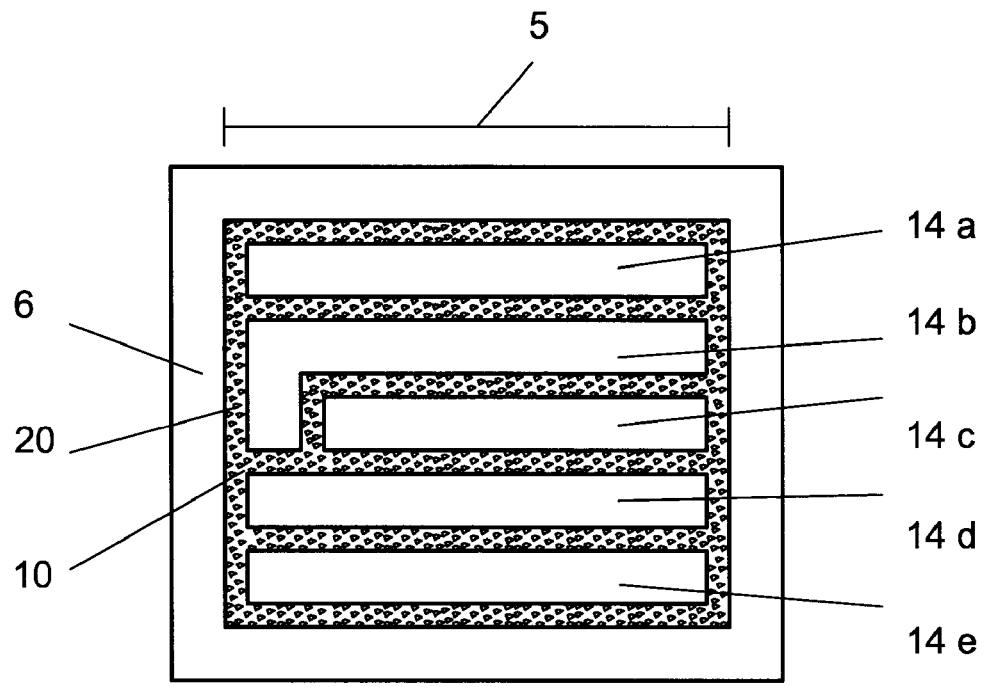
FIG. 5 shows a plan view of a third example of an arrangement according to the invention and FIG. 6 shows a sectional representation through a fourth exemplary embodiment of the arrangement according to the invention.

In the exemplary embodiments of an arrangement according to the invention that are reproduced in FIGS. 4 and 5, short silicon rods 14 form the silicon bodies. As can be seen in the sectional representation of FIG. 4, these short silicon rods 14, obtained by controlled detachment, make it possible for a higher proportion of the crucible 6 to be filled with silicon bodies, i.e. short silicon rods 14. Therefore, a smaller amount of silicon granules 18 is required to fill the cavities 10 that in turn occur. Depending on the type of silicon granules 18 used, which under some circumstances have to be laboriously purified, this may be advantageous in terms of the effort involved.

As can be seen from FIG. 4, the silicon granules 18 in this exemplary embodiment comprise both large grains 19a and small grains 19b. These may be, for example, grains obtained when crushing silicon starting material, which usually have to be purified before they are introduced into the crucible in order to prevent the introduction of impurities. Compared with the prior art, however, only a small amount of silicon needs to be laboriously purified, since most of the volume of the crucible is taken up by short silicon rods 14, which if appropriately handled do not require purification, or at most on the separating surface areas.

This is shown still more clearly by the representation of FIG. 5, which reproduces a plan view of a further exemplary embodiment of an arrangement according to the invention. In the variant shown, short silicon rods 14a, 14b, 14c, 14d and 14e are in turn provided as silicon bodies, the length of the short silicon rods 14a, 14b, 14c, 14d and 14e corresponding approximately to the width of an opening 5 of the crucible 6, and so a regular arrangement of the short silicon rods 14a, 14b, 14c, 14d and 14e is possible, allowing efficient use of the volume of the crucible.

As can be deduced from the angling of the short silicon rod 14, an angled or a U-shaped silicon rod was used as the silicon starting material. In this exemplary embodiment, grains having a diameter of approximately 0.2 to 3 mm are provided as silicon granules 20. As a result, smaller cavities 10 can also be filled with the silicon granules 20, and so a particularly efficient heat transfer from the crucible walls 7 to the short silicon rods 14a, 14b, 14c, 14d and 14e can be accomplished. The round cross section of the silicon rods, and consequently also of the short silicon rods 14a, 14b, 14c, 14d and 14e, has the consequence that the short silicon rods arranged in parallel in FIG. 5 contact one another only along a small surface area. Below (not visible in FIG. 5) and above these contact areas, the cavities are at least partially filled with silicon granules, and so efficient heat conduction is also obtained between the individual short silicon rods 14a, 14b, 14c, 14d and 14e.

Figure 6:
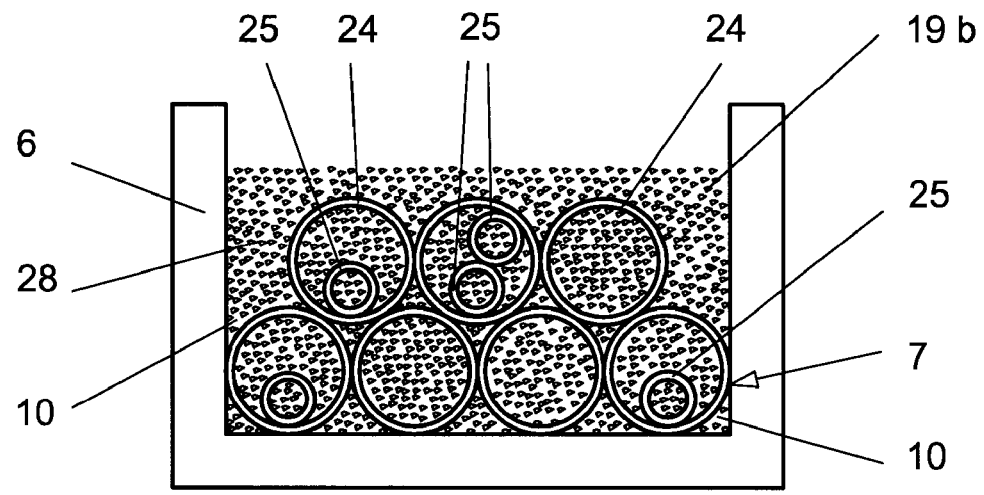

FIG. 6 shows in a schematic representation a fourth example of an arrangement according to the invention, in which short silicon tubes 24, 25 are provided as silicon bodies. These tubes have different diameters, and so short silicon tubes 25 with a small diameter can be arranged in short silicon tubes 24 with a large diameter. Alternatively or in addition, the interior spaces of the short silicon tubes 24, 25, which obviously represent cavities 10 between monolithic surface areas of the short silicon tubes 24, 25, are filled with silicon granules 28. In this exemplary embodiment, the silicon granules 28 entirely comprise small grains 19b, which preferably have an approximate diameter of 0.2 to 3 mm.

It is obvious to a person skilled in the art that the various variants of silicon bodies and of silicon granules in the various exemplary embodiments are interchangeable. For example, the silicon granules 18 from the exemplary embodiment of FIG. 4 could similarly be used in the exemplary embodiments of FIGS. 3, 5 and 6. Similarly, short silicon tubes 24, 25 in the exemplary embodiment of FIG. 3 could replace the silicon bodies 4 there. Combinations of the various types of silicon bodies 4, 14, 24, 25 or the various types of silicon granules 8, 18, 20, 28 are also possible. In addition, further variants of the invention obviously exist.

List of Designations
2 U-shaped silicon rod
4 silicon body
5 width of crucible opening
6 crucible
7 crucible wall
8 silicon granules
10 cavity
14 short silicon rod
14a short silicon rod
14b short silicon rod
14c short silicon rod
14d short silicon rod
14e short silicon rod
18 silicon granules
19a coarse grain
19b small grain
20 silicon granules
24 short silicon tube with large diameter
25 short silicon tube with small diameter
28 silicon granules
40 detaching silicon bodies
42 arranging them in the crucible
44 filling the cavities
46 heating the crucible

The invention claimed is:
1. A process for melting silicon, which comprises:
placing silicon bodies in a heatable crucible and thereby forming cavities between the silicon bodies and walls of the crucible;
filling at least some of the cavities formed between crucible walls and the silicon bodies, or between monolithic parts of the silicon bodies when the silicon bodies are disposed in the crucible, with silicon granules; and
heating the crucible and melting the silicon in the crucible.

2. The process according to claim 1, which comprises detaching the silicon bodies from a silicon starting material, and dimensioning the silicon bodies for placement in the crucible.

3. The process according to claim 2, wherein the dimensioning step is effected during the detaching step.

4. The process according to claim 2, wherein the detaching step comprises controlled detachment of the silicon bodies.

5. The process according to claim 2, wherein the detaching step comprises detaching the silicon bodies by one of laser separation, water jet cutting, and sawing.

6. The process according to claim 2, wherein the detaching step comprises a sawing process selected from the group consisting of wire sawing, band sawing, and annular sawing.

7. The process according to claim 1, which comprises placing silicon bodies having at least one dimension greater than 10 cm.

8. The process according to claim 1, which comprises placing silicon granulate with grains having a maximum diameter of approximately 10 mm.

9. The process according to claim 1, which comprises placing silicon granulate with grains having an approximate diameter of 0.3 to 10 mm.

10. The process according to claim 9, which comprises placing silicon granulate with grains having an approximate diameter of 0.3 to 2 mm.

11. The process according to claim 1, which comprises providing the silicon starting material in the form of silicon rods or silicon tubes.

12. The process according to claim 1, which comprises providing the silicon starting material in the form of a silicon material produced by chemical deposition from a vapor phase.

13. The process according to claim 12, which comprises providing the silicon starting material in the form of a silicon material produced by the Siemens process.

14. The process according to claim 1, which comprises detaching the silicon bodies from a starting material in the form of silicon rods or silicon tubes by cutting the silicon rods or the silicon tubes to length to obtain short silicon rods or short silicon tubes.

15. The process according to claim 14, which comprises cutting the short silicon rods or short silicon tubes to a length substantially corresponding to a width of an opening of the crucible.

16. The process according to claim 1, wherein the filling step comprises filling the cavities with silicon granules up to between 60 and 98%.

17. The process according to claim 1, wherein the filling step comprises filling the cavities with silicon granules up to between 85 and 98%.

* * * * *